(12) United States Patent
Hatakeyama et al.

(10) Patent No.: US 8,962,987 B2
(45) Date of Patent: Feb. 24, 2015

(54) BACK SHEET FOR SOLAR CELL AND PROCESS FOR PRODUCTION THEREOF, AND SOLAR CELL MODULE

(71) Applicant: FUJIFILM Corporation, Tokyo (JP)

(72) Inventors: Akira Hatakeyama, Kanagawa (JP); Koreshige Ito, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/890,530

(22) Filed: May 9, 2013

(65) Prior Publication Data

US 2013/0240034 A1 Sep. 19, 2013

Related U.S. Application Data

(63) Continuation of application No. PCT/JP2011/074811, filed on Oct. 27, 2011.

(30) Foreign Application Priority Data

Nov. 12, 2010 (JP) ................................. 2010-254210

(51) Int. Cl.
*H01L 31/0216* (2014.01)
*H01L 31/18* (2006.01)
(Continued)

(52) U.S. Cl.
CPC ........ *H01L 31/02167* (2013.01); *C09D 127/12* (2013.01); *H01L 31/0481* (2013.01);
(Continued)

(58) Field of Classification Search
CPC ..... Y02E 10/50; H01L 31/0487; H01L 31/18; H01L 31/0216

USPC ................. 136/256; 428/447, 341; 427/393.5
See application file for complete search history.

(56) References Cited

U.S. PATENT DOCUMENTS 5,672,640 A * 9/1997 Brauer ........................... 523/173
5,936,021 A * 8/1999 Bryant et al. .................. 524/430
(Continued)

FOREIGN PATENT DOCUMENTS

| JP | H11-509883 A | 8/1999 |
| JP | 2003-011292 A | 1/2003 |

(Continued)

OTHER PUBLICATIONS

Sabourin et al., "Effect of Nano-Aluminum and Fumed Silica Particles on Deflagration and Detonation of Nitromethane," Propellants Explos. Pyrotech., 2009, 34, 385-393.*

(Continued)

*Primary Examiner* — Ling Choi
*Assistant Examiner* — Catherine S Branch
(74) *Attorney, Agent, or Firm* — Jean C. Edwards, Esq.; Edwards Neils PLLC

(57) ABSTRACT

The present invention provides a back sheet for a solar cell, the back sheet including a polymer base and a polymer layer that is disposed by coating on at least one surface of the polymer base material, the polymer layer including an amorphous colloidal silica and, as a binder, at least one of a polymer selected from a fluorine-based polymer or a silicone-based polymer, the polymer formed by coating having excellent uniformity and the back sheet having superior weather resistance compared to conventional back sheets.

6 Claims, 1 Drawing Sheet

(51) Int. Cl.
*C09D 127/12* (2006.01)
*H01L 31/048* (2014.01)
*C08J 7/04* (2006.01)
*C08K 3/36* (2006.01)
*C08L 83/04* (2006.01)

(52) U.S. Cl.
CPC ............ *H01L31/0487* (2013.01); *H01L 31/18* (2013.01); *C08J 7/047* (2013.01); *C08K 3/36* (2013.01); *C08L 83/04* (2013.01); *Y02E 10/50* (2013.01); *C08J 2367/02* (2013.01); *C08J 2427/12* (2013.01); *C08J 2483/04* (2013.01)
USPC ......... 136/256; 248/447; 248/341; 427/393.5

(56) References Cited

U.S. PATENT DOCUMENTS

| | | | |
|---|---|---|---|
| 2007/0129478 A1 | 6/2007 | Nakamura et al. | |
| 2008/0264484 A1 | 10/2008 | Temchenko et al. | |
| 2011/0284075 A1* | 11/2011 | Hatakeyama et al. | ........ 136/259 |

FOREIGN PATENT DOCUMENTS

| | | |
|---|---|---|
| JP | 2003-062921 A | 3/2003 |
| JP | 2004-168057 A | 6/2004 |
| JP | 2007-035694 A | 2/2007 |
| JP | 2009-158952 A | 7/2009 |
| JP | 2010-519742 A | 6/2010 |
| WO | 2005/075583 A1 | 8/2005 |

OTHER PUBLICATIONS

Notice of Reasons for Rejection, issued by the Japanese Patent Office (JPO) on Jul. 2, 2013, in connection with Japanese Patent Application No. 2010-254210.

Decision to Grant a Patent, issued by the Japanese Patent Office on Jan. 28, 2014, in connection with Japanese Patent Application No. 2010-254210.

* cited by examiner

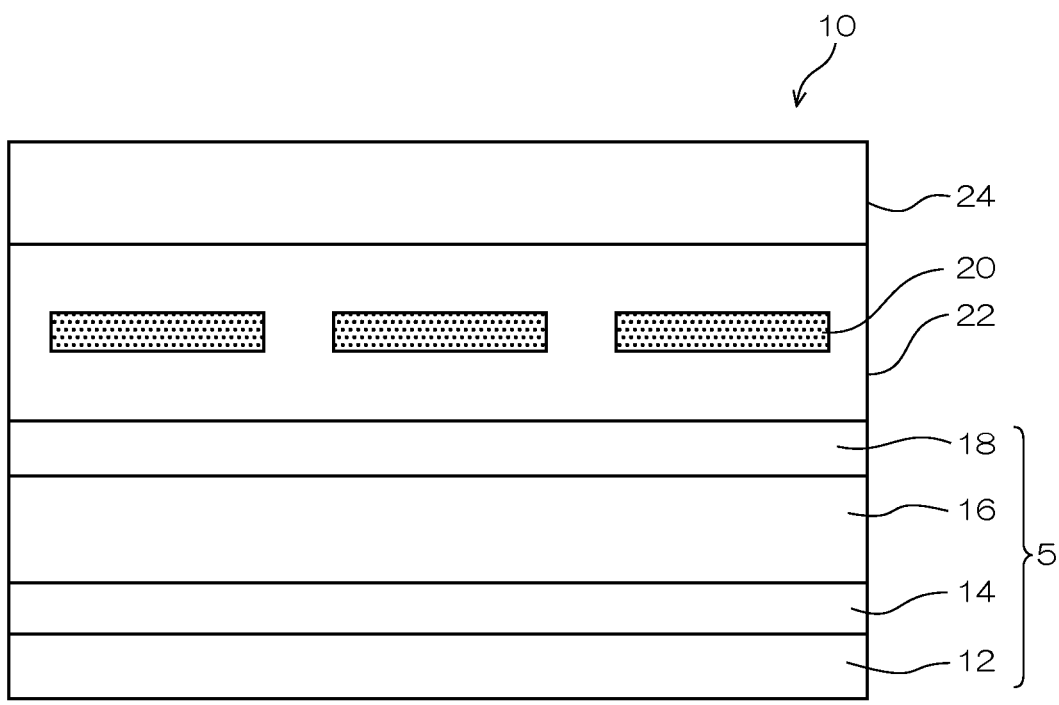

BACK SHEET FOR SOLAR CELL AND PROCESS FOR PRODUCTION THEREOF, AND SOLAR CELL MODULE

CROSS-REFERENCE TO RELATED APPLICATIONS

This application is a continuation application of, and claims priority to, International Application No. PCT/JP/2011/074811, filed Oct. 27, 2011, which was published under PCT Article 21(2) in Japanese, which is incorporated herein by reference. Further, this application claims priority from Japanese Patent Application No. 2010-254210, filed Nov. 12, 2010, which is incorporated herein by reference.

BACKGROUND OF THE INVENTION

1. Technical Field

The present invention relates to a back sheet for a solar cell, which is arranged on a side opposite to a light receiving side of a cell-side substrate equipped with a solar cell element, a process for producing the same, and a solar cell module.

2. Background Art

In conventional back sheets for solar cells, from the viewpoint of improving the weather resistance thereof in order to enhance the durability of the entire solar cell, a method of affixing a sheet of a fluorine-based polymer to the rear face of the side opposite to the side through which sunlight mainly enters is widely used.

Recently, a technique of forming a layer of a fluorine-based polymer by means of coating has also been proposed, and it is said that cost is reduced thereby. Specifically, a technique of coating with a fluorine-based polymer having a curable functional group has been disclosed (see, for example, Japanese Patent Application Laid-Open (JP-A) No. 2007-35694).

Providing a layer of a fluorine-based polymer or a silicone-based polymer by means of coating is expected to give an effect on enhancing the durability of the back sheet.

SUMMARY OF THE INVENTION

Technical Problem

However, when a fluorine-based polymer or silicone-based polymer as described above is applied, a coating defect which is called cissing (repellence) (hereinafter, may be referred to as "cissing defect") may easily occur in the resulting coated film, and this contributes to the lowering of the commercial values of a back sheet. Therefore, production of a back sheet that has a coated layer in which the occurrence of cissing is suppressed, despite using a fluorine-based polymer or a silicone-based polymer, and which has superior commercial values compared with conventional back sheets, is desired.

The present invention has been made in view of the above circumstances and aims to accomplish the following. Namely, an object of the invention is to provide a back sheet for a solar cell, in which the polymer layer has excellent uniformity in the case of using a fluorine-based polymer and/or a silicone-based polymer as a binder, and the back sheet having superior weather resistance compared with conventional back sheets; a process for producing the back sheet; and a solar cell module, with which stable electric power generation performance is obtained for a long time, regardless of the installation environment.

Solution to Problem

Exemplary embodiments of the present invention in order to address the technical problem include the followings.

<1> A back sheet for a solar cell, the back sheet including: a polymer base; and a polymer layer that is provided on at least one surface of the polymer base that includes, as a binder, a polymer selected from the group consisting of a fluorine-based polymer and a silicone-based polymer, and that includes an amorphous colloidal silica.

<2> The back sheet for a solar cell according to the item <1>, wherein a total amount of the fluorine-based polymer and the silicone-based polymer in the polymer layer is in a range of from 0.5 g/m$^2$ to 12.5 g/m$^2$.

<3> The back sheet for a solar cell according to the item <1> or the item <2>, wherein a content of the colloidal silica in the polymer layer is in a range of from 3.0% by mass to 60.0% by mass with respect to a total content of the fluorine-based polymer and the silicone-based polymer.

<4> The back sheet for a solar cell according to any one of the item <1> to the item <3>, wherein the polymer layer further includes a crosslinking agent for crosslinking the polymer in the polymer layer.

<5> The back sheet for a solar cell according to the item <4>, wherein the crosslinking agent includes a carbodiimide-based compound and/or an oxazoline-based compound.

<6> The back sheet for a solar cell according to the item <4> or the item <5>, wherein a content of the crosslinking agent is 0.5% by mass to 100% by mass with respect to a content of the polymer in the polymer layer.

<7> The back sheet for a solar cell according to any one of the item <1> to the item <6>, wherein the polymer layer further includes a surfactant.

<8> The back sheet for a solar cell according to the item <7>, wherein the surfactant includes a polyoxyalkylene alkyl ether-based nonionic surfactant.

<9> The back sheet for a solar cell according to the item <7> or the item <8>, wherein an amount of the surfactant in the polymer layer is in a range of from 0.1 mg/m$^2$ to 10 mg/m$^2$.

<10> The back sheet for a solar cell according to any one of the item <1> to the item <9>, wherein the polymer layer is disposed on a side of the polymer base opposite to a side at which a solar cell element is to be disposed.

<11> A method of producing a back sheet for a solar cell, the method including forming a polymer layer by: applying, onto at least one surface of a polymer base, a coating liquid that includes, as a binder, a polymer selected from the group consisting of a fluorine-based polymer and a silicone-based polymer, and that includes an amorphous colloidal silica; and drying the applied coating liquid to obtain a polymer layer.

<12> A solar cell module including a transparent substrate through which sunlight enters, a solar cell element, and the back sheet for a solar cell according to any one of the item <1> to the item <9>, the back sheet for a solar cell being disposed on a side of the solar cell element opposite to a side at which a substrate is disposed.

Advantageous Effect of Invention

According to the present invention, a back sheet for a solar cell, in which the polymer layer has excellent uniformity in the case of using a fluorine-based polymer and/or a silicone-based polymer as a binder and the back sheet has superior weather resistance compared with conventional back sheets, and a process for producing the back sheet may be provided.

Further, according to the present invention, a solar cell module, with which a stable electric power generation performance is obtained for a long time regardless of the installation environment, may be provided.

BRIEF DESCRIPTION OF THE DRAWINGS

FIG. 1 is a cross-sectional diagram schematically showing an example of the configuration of a solar cell module.

DESCRIPTION OF EMBODIMENTS

Hereinafter, a back sheet for a solar cell of the present invention, a process for producing the back sheet, and a solar cell module using the back sheet are described in detail.
<Back Sheet for Solar Cell and Process for Producing the Same>

The back sheet for a solar cell of the present invention includes a polymer base material, and a polymer layer which is provided on at least one surface of the polymer base material and contains a polymer selected from a fluorine-based polymer or a silicone-based polymer as at least one kind of binder and amorphous colloidal silica. The back sheet for a solar cell of the present invention may be constituted by only a polymer base material and the polymer layer, or may further have one or more additional layers other than the polymer layer, for example, a colored layer, an easy adhesion layer, an undercoat layer, or the like, on the surface of the polymer base material or on the surface of the polymer layer, as necessary. Only one additional layer may be provided, or two or more additional layers may be provided.

In the present invention, in the case of using a fluorine-based polymer or a silicone-based polymer as a binder component of a polymer layer that is provided on at least one surface of the polymer base material (preferably, on the surface of the side of the polymer base material opposite to the side at which the solar cell element is to be disposed), by the coexistence of an amorphous colloidal silica with the polymer, the occurrence of cissing defects, which may easily occur in the formation of a polymer layer by coating, is suppressed, and thus, a back sheet for a solar cell which has a polymer layer having excellent uniformity is obtained. Accordingly, durability especially under an environment in which temperature and humidity vary, or under a hot and humid environment including a large amount of heat or moisture (humidity) is enhanced and, as a result, even in the case of constituting a solar cell module and placing the solar cell module under every environmental condition, electric power generation performance is stably ensured for a long time.

—Polymer Base Material—

The back sheet for a solar cell of the present invention is equipped with a polymer base material (support).

Examples of the polymer base material include base materials produced by using a polyester, a polyolefin such as polypropylene or polyethylene, a fluorine-based polymer such as polyvinyl fluoride, or the like. Among them, a polyester base material is preferable from the viewpoints of cost, mechanical strength, and the like.

Polyester usable in exemplary embodiments of the invention as a polymer base (support) is saturated linear polyester synthesized by a reaction of an aromatic dibasic acid or an ester formable derivative thereof with a diol or an ester formable derivative thereof. Examples of the polyester include polyethylene terephthalate, polyethylene isophthalate, polybutylene terephthalate, poly 1,4-cyclohexylenedimethylene terephthalate, polyethylene 2,6-naphthalate and the like. Among them, polyethylene terephthalate or polyethylene 2,6-naphthalate is preferable from viewpoint of a balance of mechanical strength, cost and the like.

The polyester may be a homo-polymer or a co-polymer. In addition, the polyester may be blended with a small amount of the other kinds of reins such as polyimide.

When the polyester of the present invention is polymerized, from the viewpoint of suppressing the amount of carboxy group in the polyester after being polymerized within a predetermined range, a compound of Sb-based, Ge-based, or Ti-based is preferably used as a catalyst. Among these, a Ti-based compound is particularly preferable. When the Ti-based compound is used, in a preferred embodiment, polymerization is performed by using the Ti-based compound as a catalyst in an amount that corresponds to a content of Ti element of from 1 ppm to 30 ppm in the polyester after being polymerized and more preferably from 3 ppm to 15 ppm. When the amount of the Ti-based compound is in the above range as the amount that corresponds to a content of Ti element, end carboxy group in the polyester after being polymerized may be adjusted within the following range, and hydrolysis resistance of the polymer base may be kept low.

Polyester synthesis using the titanium-based compound may be performed by applying a method described in Japanese published examined application patent No. 8-301,198, Japanese patent Nos. 2,543,624, 3,335,683, 3,717,380, 3,897,756, 3,962,226, 3,979,866, 3,996,871, 4,000,867, 4,053,837, 4,127,119, 4,134,710, 4,159,154, 4,269,704, 4,313,538, and the like.

The content of carboxy group in the polyester is preferably in a range from 2 eq. (equivalent)/t to 50 eq./t and more preferably in a range from 3 eq./t to 35 eq./t. When the content of carboxy group is 50 eq./t or less, hydrolysis resistance may be kept unchanged and lowering in the strength after a lapse of time under heat and moisture may be suppressed small. The lower limit of the content of carboxy group is 2 eq./t desirably, from the viewpoint of keeping adhesion to a layer (for instance, a colored layer) that is formed on the polyester.

The content of carboxy group in the polyester may be adjusted by selecting the kind of the catalyst and film forming conditions (film forming temperature or time). In the present specification, "eq./t" refers mole equivalent per one ton.

The polyester of the present invention is preferably subjected to solid phase polymerization after polymerization. By means of this, a preferable content of carboxy group may be attained. Solid phase polymerization may be performed in a continuous process (a process where a tower is filled with resins; the resins are made to stagnate slowly for a predetermined time while heated; and then the resins are fed out), or a batch-wise process (a process where resins are loaded in a container, and then heated for a predetermined time). Specifically, a synthetic method described in Japanese patent Nos. 2,621,563, 3,121,876, 3,136,774, 3,603,585, 3,616,522, 3,617,340, 3,680,523, 3,717,392, 4,167,159, and the like, is applicable to the solid phase polymerization of polyester.

The solid phase polymerization of the polyester is preferably performed at a temperature in a range of from 170° C. or higher and 240° C. or lower, more preferably in a range of from 180° C. or higher and 230° C. or lower, and even more preferably in a range of from 190° C. or higher and 220° C. or lower. The solid phase polymerization of the polyester is preferably performed in a vacuum or under nitrogen gas atmosphere.

The polyester base material of the present invention is preferably a biaxially stretched film, which is stretched for instance as: the above polyester is fused and extruded into a film-form; the film-form polyester is cooled and solidified with a casting drum into a non-stretched film; the non-stretched film is stretched in a longitudinal direction at a temperature of from Tg to (Tg+60)° C. one time or two or more times in a manner that stretch (total stretch when stretching is performed two or more times) becomes from 3 times to 6 times; and then the film is further stretched in a transverse direction at a temperature of from Tg to (Tg+60)° C. in a manner that total stretch becomes from 3 times to 5 times.

The polyester base material may be further subjected to heat treatment for from 1 sec to 60 sec at a temperature of from 180° C. to 230° C., when needed.

Note that, "Tg" represents a glass transition temperature, and can be measured in accordance with JIS K7121, ASTM D3418-82, or the like. For example, in the present invention, Tg can be measured using a differential scanning calorimeter (DSC) manufactured by Shimadzu Corporation.

Specifically, as a sample, 10 mg of a polymer such as polyester or the like are weighed and set in an aluminum pan, and while elevating the temperature from room temperature to the final temperature of 300° C. at a temperature elevating rate of 10° C./min, the heat quantity versus temperature is measured using a DSC device. The temperature of the peak top of the DSC curve is designated as the glass transition temperature.

The thickness of the polymer base material (particularly, polyester base material) is preferably from about 25 μm to about 300 μm. When the thickness is 25 μm or more, the polymer base material has a satisfactory mechanical strength, and when the thickness is 300 μm or less, it is advantageous in terms of cost.

Particularly, polyester base materials undergo deterioration in the hydrolysis resistance as the thickness increases, and tend to become unsatisfactory for long-term use. Thus, in the present invention, in a case in which the thickness of the polyester base material is from 120 μm to 300 μm and the content of carboxy groups in the polyester is from 2 eq./t to 50 eq./t, an effect of enhancing durability against moisture and heat is further provided, which is thus preferable.

—Polymer Layer—

The back sheet for a solar cell of the present invention is constituted by providing a polymer layer on one or two sides of the polymer base material by a coating method. The polymer layer contains a polymer selected from a fluorine-based polymer or a silicone-based polymer as a binder and an amorphous colloidal silica. The polymer layer may further contain other components such as a crosslinking agent, a pigment, or various additives, as necessary. Only one polymer layer may be provided, or two or more polymer layers may be provided.

(Binder)

The polymer layer in the present invention contains, as a binder, at least one kind of polymer selected from a fluorine-based polymer or a silicone-based polymer. By using the colloidal silica described below in combination, it is possible to contain a fluorine-based polymer and/or a silicone-based polymer as the binder component of the polymer layer to be disposed on the polymer base material, and incorporation of these polymers makes it possible to drastically enhance the weather resistance of the back sheet, especially, durability under an environment in which temperature and humidity vary, or under a hot and humid environment including a large amount of heat or moisture (humidity).

As the fluorine-based polymer, a polymer having a repeating unit represented by —(CFX$^1$—CX$^2$X$^3$)— is preferable. In the above repeating unit, X$^1$, X$^2$ and X$^3$ each independently represent a hydrogen atom, a fluorine atom, a chlorine atom, or a perfluoroalkyl group having from 1 to 3 carbon atoms.

Specific examples of the fluorine-based polymer include polytetrafluoroethylene (hereinafter, may be indicated as PTFE), polyvinyl fluoride (hereinafter, may be indicated as PVF), polyvinylidene fluoride (hereinafter, may be indicated as PVDF), polychlorotrifluoroethylene (hereinafter, may be indicated as PCTFE), polytetrafluoropropylene (hereinafter, may be indicated as HFP) and the like.

The fluorine-based polymer may be a homopolymer obtained by polymerizing a single monomer, or may be a copolymer of two or more kinds of monomers. Examples of this copolymer include a copolymer obtained by copolymerizing tetrafluoroethylene and tetrafluoropropylene (abbreviated to P(TFE/HFP)), and a copolymer obtained by copolymerizing tetrafluoroethylene and vinylidene fluoride (abbreviated to P(TFE/VDF)).

The fluorine-based polymer may be a polymer obtained by copolymerizing a fluorine-based monomer having a partial structure represented by formula —(CFX$^1$—CX$^2$X$^3$)— and another monomer. Examples of this copolymer include a copolymer of tetrafluoroethylene and ethylene (abbreviated to P(TFE/E)), a copolymer of tetrafluoroethylene and propylene (abbreviated to P(TFE/P)), a copolymer of tetrafluoroethylene and vinyl ether (abbreviated to P(TFE/VE)), a copolymer of tetrafluoroethylene and perfluorovinyl ether (abbreviated to P(TFE/FVE)), a copolymer of chlorotrifluoroethylene and vinyl ether (abbreviated to P(CTFE/VE)), a copolymer of chlorotrifluoroethylene and perfluorovinyl ether (abbreviated to P(CTFE/FVE)) and the like.

The fluorine-based polymers may be a polymer that is used in the form of a solution of a polymer in an organic solvent, or may be polymers that are used in the form of a dispersion of polymer particles in water. In a viewpoint of light environmental burden, a dispersion of polymer particles in water is preferred. Examples of aqueous dispersions of fluorine-based polymers include those described in JP-A No. 2003-231722, JP-A No. 2002-20409, and JP-A No. 9-194538.

As the fluorine-based polymer, a commercially available product currently marketed may be used, and examples of the commercially available product may include OBBLIGATO SW0011F (trade name, manufactured by AGC COAT-TECH CO., LTD.) and the like.

Examples of the silicone-based polymer include a composite polymer of silicone and acryl, a composite polymer of silicone and polyester, and the like. As the silicone-based polymer, a commercially available product currently marketed may be used and, for example, specific examples of the composite polymer of silicone and acryl may include CERANATE WSA-1060 and CERANATE WSA-1070 (all trade names, manufactured by DIC Corporation); H7620, H7630, and H7650 (all trade names, manufactured by Asahi Kasei Chemicals Corporation); and the like.

In the polymer layer according to the present invention, the above-described fluorine-based polymer and/or silicone-based polymer and an additional polymer other than these polymers may be used in combination, to the extent of not impairing the effects of the present invention. In the case of using an additional polymer in combination, it is preferable that the amount of the additional polymer other than the fluorine-based polymer or the silicone-based polymer is 50% by mass or less based on the total mass of the binder. The amount of the additional polymer being 50% by mass or less makes it possible to exhibit a more satisfactory weather resistance, when prepared as a back sheet.

The additional polymer may be selected from known polymers such as polyester-based polymers (for example, polyesters such as polyethylene terephthalate (PET) or polyethylene-2,6-naphthalate (PEN)), polyurethane-based polymers (for example, polymers formed from hexamethylene diisocyanate or toluene diisocyanate and ethylene glycol or propylene glycol, or the like), acryl-based polymers (for example, polymers including polymethyl methacrylate, polyethyl acrylate, or the like), or polyolefin-based polymers (for example, polymers formed from polyethylene and (meth) acrylic acid, or the like), and used.

The total amount of the fluorine-based polymer and the silicone-based polymer in the polymer layer is preferably in a range of from 0.5 g/m² to 12.5 g/m². When the total amount of the fluorine-based polymer and the silicone-based polymer is 0.5 g/m² or higher, the durability performance when exposed to temperature and humidity variation or a high humidity and heat environment may be further enhanced, and when the total amount is 12.5 g/m² or lower, it is possible to add a desired amount of crosslinking agent or surfactant, which is thus advantageous in terms of the film strength or the coated surface state.

Above all, based on the reasons as described above, the total amount of the fluorine-based polymer and the silicone-based polymer is more preferably in a range of from 1.0 g/m² to 12.0 g/m².

(Colloidal Silica)

The polymer layer in the present invention contains at least one kind of amorphous colloidal silica. Two or more different kinds of colloidal silica may be used in combination. In the case of forming a layer by coating using a fluorine-based or silicone-based resin material, the coated film tends to be repelled on the polymer base material and tends to readily cause coating defects (cissing defects); however, in the present invention, since a coating liquid prepared by using colloidal silica together with these resin materials is coated, the occurrence of cissing defects is suppressed at the time of coating, and thus a polymer layer having excellent uniformity in thickness or in surface property is obtained.

Colloidal silica includes silicon dioxide (including hydrates thereof) as a main component, and is colloid that includes fine particles of inorganic oxides containing silicon, in which an average particle diameter of the fine particles is several hundred nm or less. Further, colloidal silica may contain aluminate as a minor component. Examples of the aluminate, which may be contained as a minor component, include sodium aluminate, potassium aluminate, and the like.

Moreover, colloidal silica may contain an inorganic salt such as sodium hydroxide, potassium hydroxide, lithium hydroxide, or ammonium hydroxide, or an organic salt such as tetramethylammonium hydroxide or the like. The inorganic salt or the organic salt functions, for example, as a stabilizer of colloid.

The dispersing medium for colloidal silica is not particularly limited and may be any of water, an organic solvent, or a mixture of water and an organic solvent. The organic solvent may be either a water-soluble organic solvent or a water-insoluble organic solvent, but is preferably a water-soluble organic solvent. Specific examples there of include methanol, ethanol, isopropyl alcohol, n-propanol, and the like. Colloidal silica can be produced by a generally used method. For example, colloidal silica can be produced through an Aerosil synthesis by thermal decomposition of silicon tetrachloride, or may be produced from water glass. Alternatively, colloidal silica can be produced according to a liquid phase synthesis method including hydrolysis of an alkoxide (see, for example, "Seni to Kogyo (Fiber and Industry)", vol. 60, No. 7 (2004) page 376), or the like.

Generally, there are a colloidal silica in which the particle shape is spherical, and an amorphous colloidal silica. The colloidal silica in the present invention is an amorphous colloidal silica, and specifically, has a structure in which plural spherical particles (primary particles) are linked together, for example, to form a chain-like shape.

There is no particular limitation on the average primary particle diameter of the particles contained in the colloidal silica. For example, the average primary particle diameter of the particles contained in the colloidal silica is preferably in a range of from 1 nm to 200 nm, more preferably in a range of from 1 nm to 100 nm, even more preferably in a range of from 3 nm to 50 nm, and particularly preferably in a range of from 4 nm to 25 nm. When the average primary particle diameter is 200 nm or less, a satisfactory coated surface state may be obtained, and when the average primary particle diameter is 1 nm or more, the colloidal silica may exhibit excellent stability.

Note that, the average primary particle diameter is a value measured in accordance with a light scattering method using a laser diffraction/scattering type particle diameter distribution measuring apparatus LA950 (trade name, manufactured by Horiba Ltd.).

Regarding the particle diameter of the amorphous colloidal silica in the present invention, in which plural primary particles are bonded, the diameter when the shape of the amorphous colloidal silica is considered to be spherical is preferably in a range of from 10 nm to 200 nm, more preferably in a range of from 30 nm to 180 nm, and even more preferably in a range of from 50 nm to 150 nm. When the particle diameter of the colloidal silica in terms of the above diameter is 10 nm or more, a better effect on suppression of cissing may be obtained, and when the particle diameter in terms of the above diameter is 200 nm or less, the colloidal silica can be maintained stable in the coating liquid.

The particle diameter of the amorphous colloidal silica, in which plural primary particles are bonded, is a value measured in accordance with a light scattering method using a laser diffraction/scattering type particle diameter distribution measuring apparatus LA950 (trade name, manufactured by Horiba Ltd.).

As the amorphous colloidal silica, a commercially available product currently marketed may be used, and examples of the commercially available product may include SNOWTEX UP, SNOWTEX OUP, SNOWTEX PS-S, SNOWTEX PS-M, and SNOWTEX PS-MO (all trade names, manufactured by Nissan Chemical Industries, Ltd.) and the like.

The pH of the dispersion liquid, which disperses and includes the colloidal silica is generally adjusted to pH of acidic or alkaline. This is because the region where colloidal silica is stably dispersed exists in an acidic side or alkaline side. In the case of adding a commercially available colloidal silica dispersion liquid to a coating liquid, it is preferable to add a neutral to alkaline colloidal silica dispersion liquid, taking the pH of the region where the colloidal silica is stably dispersed and the stability of the coating liquid into consideration.

There is no particular limitation on the content of the colloidal silica. The content of the colloidal silica can be set, for example, from 0.1% by mass to 6.5% by mass with respect to the total amount of the coating liquid. The content of the colloidal silica is preferably from 1.0% by mass to 5.0% by mass with respect to the total amount of the coating liquid. When the content of the colloidal silica in the coating liquid is within the above range, cissing of the coating liquid which may easily occur at the time of coating is suppressed, and the effect on enhancing the weather resistance when prepared as a solar cell module is great, which is thus advantageous.

Further, the content of the colloidal silica with respect to the total content of the fluorine-based polymer and the silicone-based polymer is preferably in a range of from 3.0% by mass to 60.0% by mass, and more preferably in a range of from 5.0% by mass to 50% by mass. When the proportion of the colloidal silica relative to the total amount of the fluorine-based polymer and the silicone-based polymer is 3.0% by mass or higher, the effects on suppressing cissing of the coating liquid, which may easily occur at the time of coating is remarkable. Further, when the proportion is 60.0% by mass or lower, it is advantageous in terms of the surface state.

(Crosslinking Agent)

The polymer layer may contain a crosslinking agent for the purpose of crosslinking the polymer in the layer.

Examples of the crosslinking agent may include epoxy, isocyanate, melamine, carbodiimide, and oxazoline crosslinking agents. Among them, from the viewpoint of ensuring the adhesiveness after a lapse of time under heat and moisture, a carbodiimide crosslinking agent and an oxazoline crosslinking agent are preferable.

Specific examples of the carbodiimide crosslinking agent include N,N'-dicyclohexylcarbodiimide, N,N'-diisopropylcarbodiimide, 1-ethyl-3-(3-dimethylaminopropyl)carbodiimide hydrochloride, N-[3-(dimethylamino)propyl]-N'-ethylcarbodiimide, N-[3-(dimethylamino)propyl]-N'-propylcarbodiimide, N-tert-butyl-N'-ethylcarbodiimide, and the like.

Further, examples of a commercially available product currently marketed include CARBODILITE V-02-L2 (trade name, manufactured by Nisshinbo Holdings, Inc.) and the like.

Specific examples of the oxazoline crosslinking agent include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis(2-oxazoline), 2,2'-methylene-bis(2-oxazoline), 2,2'-ethylene-bis(2-oxazoline), 2,2'-trimethylene-bis(2-oxazoline), 2,2'-tetramethylene-bis(2-oxazoline), 2,2'-hexamethylene-bis(2-oxazoline), 2,2'-octamethylene-bis(2-oxazoline), 2,2'-ethylene-bis(4,4'-dimethyl-2-oxazoline), 2,2'-p-phenylene-bis(2-oxazoline), 2,2'-m-phenylene-bis(2-oxazoline), 2,2'-m-phenylene-bis(4,4'-dimethyl-2-oxazoline), bis(2-oxazolinylcyclohexane) sulfide, bis(2-oxazolinylnorbornane) sulfide, and the like. Further, (co)polymers of these compounds may also be preferably used.

Moreover, as commercially available products currently marketed, EPOCROS WS-700 and EPOCROS K-2020E (all trade names, manufactured by Nippon Shokubai Co., Ltd.), and the like can be used.

The content of the crosslinking agent in the polymer layer is preferably from 0.5% by mass to 100% by mass, more preferably from 0.5% by mass to 50% by mass, and even more preferably from 5.0% by mass to 30% by mass, with respect to a content of the binder. When the content of the crosslinking agent is 0.5% by mass or higher, a sufficient crosslinking effect may be obtained while maintaining the strength and adhesiveness of the polymer layer, and when the content is 100% by mass or lower, particularly 50% by mass or lower, the pot life of the liquid when a coating liquid is prepared for forming the polymer layer can be maintained long.

(Pigment)

The polymer layer in the present invention may contain a pigment and may be formed as a colored layer. In this case, the same pigments as those used in the colored layer described below can be used, and preferable embodiments are also the same. For example, a pigment having a desired hue may be added to give design properties, or a white pigment may be added to impart the function as a reflective layer to the polymer layer.

(Other Additives)

The polymer layer in the present invention may contain, as necessary, other additives such as a surfactant, a filler, or the like.

As the surfactant, known surfactants of anionic type or nonionic type (for example, a polyoxyalkylene alkyl ether with an alkylene chain having 2 or 3 carbon atoms and an alkyl group having from 1 to 30 carbon atoms, preferably from 2 to 24 carbon atoms, and more preferably from 6 to 24 carbon atoms; or the like) can be used. In the case of adding a surfactant, the amount of the surfactant in the polymer layer is preferably in a range of from 0.1 mg/m$^2$ to 10 mg/m$^2$, and more preferably from 0.5 mg/m$^2$ to 3 mg/m$^2$. When the amount of the surfactant is 0.1 mg/m$^2$ or higher, the occurrence of cissing in the case of forming a layer is suppressed and a more satisfactory layer can be obtained. When the amount is 10 mg/m$^2$ or lower, adhesion between the polymer base material and the polymer layer can be maintained to be satisfactory.

As the filler, known fillers (inorganic fine particles) such as titanium dioxide or the like can be used. In the case of adding a filler, the content of the filler in the polymer layer is preferably 20% by mass or lower, and more preferably 15% by mass or lower, with respect to the amount of binder in the polymer layer. When the content of the filler is 20% by mass or lower, the film surface state of the coated film may be maintained to be more satisfactory. The lower limit of the content of the filler is preferably 0.5% by mass. When the content of the filler is 0.5% by mass or higher, the adhesiveness after a lapse of time under heat and moisture is also satisfactory. The content of the filler is more preferably in a range of from 1% by mass to 15% by mass.

The thickness of the polymer layer in the present invention is preferably from 0.5 μm to 4.0 μm. When the thickness of the polymer layer is 0.5 μm or more, higher durability performance is obtained and, in addition, the adhesive power with respect to the polymer support becomes satisfactory. Further, when the thickness of the polymer layer is 4.0 μm or less, a more satisfactory surface state is obtained, and the adhesive power with respect to the adjacent layer or the polymer base material is excellent. Namely, when the thickness of the polymer layer is within the range of from 0.5 μm to 4.0 μm, the durability and the surface state of the polymer layer are compatible, and the adhesiveness between the polymer base material and the polymer layer is more excellent.

The thickness of the polymer layer is particularly preferably in a range of from 1.0 μm to 3.5 μm.

—Colored Layer—

It is preferable that the back sheet for a solar cell of the present invention has a colored layer on the light receiving side of the polymer base material. For example, in a preferable embodiment, a colored layer is provided on the light receiving side (the side that faces the cell-side substrate provided with a solar cell element) of the polymer base material, and the above-described polymer layer according to the present invention is provided, as a rear face protective layer, on the side opposite to the side at which the colored layer is provided.

The colored layer in the present invention contains at least a pigment and a binder, and may further contain, as necessary, other components such as various additives.

The functions of the colored layer may include, firstly, an enhancement of the power generation efficiency of solar cell modules by reflecting a portion of incident light which passes through a photovoltaic cell and reaches the back sheet without being used in the power generation, to return the portion of light to the photovoltaic cell; and secondly, an enhancement of the decorative properties of the external appearance when the solar cell module is viewed from the side through which sunlight enters (front surface side). Generally, when a solar cell modules is viewed from the front surface side (glass substrate side), the back sheet is seen around the photovoltaic cell. Thus, when a colored layer is provided in the polymer sheet for back sheets, the decorative (design) properties of the back sheet are improved, and thereby the appearance may be improved.

(Pigment)

The colored layer according to the invention contains at least one pigment.

As the pigment, for example, an inorganic pigment such as titanium dioxide, barium sulfate, silicon oxide, aluminum oxide, magnesium oxide, calcium carbonate, kaolin, talc, ultramarine blue, Prussian blue, or carbon black; or an organic pigment such as phthalocyanine blue or phthalocyanine green can be appropriately selected and incorporated.

In the case where the colored layer is constructed as a reflective layer which reflects the light that has entered a solar cell and passed through the photovoltaic cell, and returns the light to the photovoltaic cell, it is preferable that the colored layer contain a white inorganic particle. Preferable examples of the white inorganic particle include a white pigment such as titanium dioxide, barium sulfate, silicon oxide, aluminum oxide, magnesium oxide, calcium carbonate, kaolin, and talc. Among them, titanium dioxide is preferable.

In the case of forming a reflective layer, the content of the white inorganic particle in the reflective layer is preferably in a range of from 30% by mass to 90% by mass, with respect to the total mass of the polymer and the white inorganic particle. The content of the white inorganic particle is more preferably in a range of from 50% by mass to 85% by mass. When the content of the white inorganic particle in the reflective layer is 30% by mass or higher, a satisfactory reflectance may be obtained, and when the content is 90% by mass or lower, reduction in the weight of the back sheet for a solar cell may be realized.

The amount of the pigment in the colored layer is preferably in the range of 2.5 $g/m^2$ to 12 $g/m^2$ and more preferably in the range of 2.5 $g/m^2$ to 8.5 $g/m^2$. When the amount of the pigment is 2.5 $g/m^2$ or greater, necessary coloration may be achieved, and a desired reflectance or decorative properties may be effectively imparted to the colored layer. Furthermore, when the amount of the pigment in the colored layer is 12 $g/m^2$ or less, the surface state of the colored layer may be easily maintained satisfactory, and the film strength is more excellent.

In the case of providing the colored layer as a reflective layer, it is preferable that the amount of the white inorganic particle in the reflective layer is in a range of from 4 $g/m^2$ to 12 $g/m^2$. When the amount of the white inorganic particle is 4 $g/m^2$ or higher, a necessary reflectance is easily obtained, and when the amount is 12 $g/m^2$ or lower, reduction in the weight of the back sheet may be realized. Above all, the amount of the white inorganic particle in the reflective layer is more preferably in a range of from 5 $g/m^2$ to 11 $g/m^2$.

Further, in a case in which the reflective layer contains two or more kinds of white inorganic particles, the total amount of the whole white inorganic particles in the reflective layer is preferably set in the range of from 4 $g/m^2$ to 12 $g/m^2$.

The volume average particle diameter of the pigment is preferably 0.03 μm to 0.8 μm, and more preferably about 0.15 μm to 0.5 μm. When the average particle diameter is in the range mentioned above, the efficiency of light reflection is high. The volume average particle diameter is a value measured with a laser diffraction/scattering type particle diameter distribution measuring apparatus LA950 (trade name, manufactured by Horiba, Ltd.).

Examples of the binder that constitutes the colored layer include a polyester resin, a polyurethane resin, an acrylic resin, a polyolefin resin, and a silicone resin. Among these, an acrylic resin and a polyolefin resin are preferred from the viewpoint of securing high adhesiveness. Furthermore, a composite resin may also be used, and for example, an acrylic/silicone composite resin is another preferable binder.

The content of the binder is preferably in the range of 15% by mass to 200% by mass, and more preferably in the range of 17% by mass to 100% by mass, based on the content of the pigment. When the content of the binder is 15% by mass or more, the strength of the colored layer is sufficiently obtained, and when the content is 200% by mass or less, the reflectance or decorative properties can be maintained satisfactorily.

(Additives)

The colored layer may further contain a crosslinking agent, a surfactant, a filler, and the like as necessary.

Examples of the crosslinking agent include epoxy, isocyanate, melamine, carbodiimide and oxazoline crosslinking agents. A preferred embodiment and details of the crosslinking agent, in particular, of carbodiimide and oxazoline crosslinking agents are the same as those set forth in the polymer layer. An additive amount of the crosslinking agent is preferably 5% by mass to 50% by mass, and more preferably 10% by mass to 40% by mass, with respect to a content of the binder in the colored layer.

As the surfactant, known surfactants of anionic type or nonionic type can be used. A preferred embodiment and details of the surfactant are the same as those set forth in the polymer layer. In the case of adding a surfactant, the amount of the surfactant is preferably from 0.1 $mg/m^2$ to 15 $mg/m^2$, and more preferably from 0.5 $mg/m^2$ to 5 $mg/m^2$.

As the filler, known fillers such as colloidal silica or titanium dioxide can be used. The content of the filler is preferably 20% by mass or lower, and more preferably 15% by mass or lower, with respect to a content of the binder in the colored layer.

The formation of the colored layer can be carried out by a method of affixing a polymer sheet containing a pigment to a polymer base material; a method of co-extruding the colored layer during the formation of the substrate; a method based on coating; or the like. Specifically, the colored layer can be formed directly, or via an undercoat layer having a thickness of 2 μm or less, on the surface of a polymer base material by performing affixing, co-extruding, coating or the like. The colored layer thus formed may be in a state of being in direct contact with the surface of the polymer base material, or may be in a state of being laminated via an undercoat layer on the surface of the polymer base material.

Among the methods described above, a method based on coating is preferable from the viewpoint that the method is convenient, and it is possible to form a uniform thin film.

In the case of performing coating, known coating methods using, for example, a gravure coater or a bar coater can be used.

The coating liquid may be an aqueous type using water as a coating solvent, or a solvent type using an organic solvent such as toluene or methyl ethyl ketone. Among these, from the viewpoint of environmental load, it is preferable to use water as the solvent. The coating solvent may be such that one kind may be used alone, or two or more kinds may be used in mixture.

Specifically, for example, in the case of forming a reflective layer, the reflective layer can be formed by coating a coating liquid for forming a reflective layer, the coating liquid containing a white inorganic particle, a binder, and other components which may be contained as needs arise, on a side of the surface of the polymer base material at which the polymer layer described above is not formed.

—Easy Adhesion Layer—

The back sheet for a solar cell of the present invention may further have an easy adhesion layer (particularly, on the colored layer). The easy adhesion layer is a layer intended to easily and firmly adhere the back sheet to a cell-side substrate (main body of the cell) equipped with a solar cell element, for example, to a sealing material that seals the solar cell element of the cell-side substrate.

The easy adhesion layer can be constituted by using a binder and inorganic fine particles, and may further include, as necessary, other components such as additives. It is preferable that the easy adhesion layer is constituted so as to have an adhesive power of 10 N/cm or more (preferably, 20 N/cm or more), with respect to the sealing material (for example, ethylene-vinyl acetate (EVA; an ethylene-vinyl acetate copolymer), polyvinyl butyral (PVB), an epoxy resin, or the like) that seals the solar cell elements of the cell-side substrate. When the adhesive power is 10 N/cm or more, resistance to moisture and heat, that makes it possible to maintain adhesiveness, may be obtained easily.

The adhesive power can be adjusted by a method of regulating the amounts of the binder and the inorganic fine particles in the easy adhesion layer, a method of performing a corona treatment to the surface which is adhered to the cell-side substrate (particularly, the sealing material) in the back sheet, or the like.

(Binder)

The easy adhesion layer can contain at least one binder.

Examples of the binder that is suitable for the easy adhesion layer include a polyester, a polyurethane, an acrylic resin, and a polyolefin. Among these, an acrylic resin and a polyolefin are preferable from the viewpoint of durability. Furthermore, a composite resin of acrylic resin and silicone is also preferable as the acrylic resin.

Preferable examples of the binder include, as specific examples of the polyolefin, CHEMIPEARL S-120 and S-75N (trade names, all manufactured by Mitsui Chemicals, Inc.); as specific examples of the acrylic resin, JURYMER ET-410 and SEK-301 (trade names, all manufactured by Nihon Junyaku Co., Ltd.); and as specific examples of the composite resin of acrylic resin and silicone, CERANATE WSA-1060 and WSA-1070 (trade names, all manufactured by DIC Corp.), H7620, H7630 and H7650 (trade names, all manufactured by Asahi Kasei Chemicals Corp.).

The amount of the binder in the easy adhesion layer is preferably set in the range of 0.05 g/m$^2$ to 5 g/m$^2$. Among others, an amount in the range of 0.08 g/m$^2$ to 3 g/m$^2$ is more preferred. When the amount of the binder is 0.05 g/m$^2$ or greater, a desired adhesion force may be easily obtained, and when the amount of the binder is 5 g/m$^2$ or less, a more satisfactory surface state may be obtained.

(Inorganic Fine Particles)

The easy adhesion layer can contain at least one kind of inorganic fine particles.

Examples of the inorganic fine particles include fine particles of silica, calcium carbonate, magnesium oxide, magnesium carbonate and tin oxide. Among these, the fine particles of tin oxide and silica are preferable from the viewpoint that the decrease in adhesiveness is small when the easy adhesion layer is exposed to a hot and humid atmosphere.

The volume average particle diameter of the inorganic fine particles is preferably about 10 nm to 700 nm, and more preferably about 20 nm to 300 nm. When the particle diameter is in this range, more satisfactory adhesiveness can be obtained. The particle diameter is a value measured with a laser diffraction/scattering type particle diameter distribution measuring apparatus LA950 (trade name, manufactured by Horiba, Ltd.).

There are no particular limitations on the shape of the inorganic fine particles, and any of a spherical shape, an amorphous shape, a needle shape and the like can be used.

The content of the inorganic fine particles is preferably in the range of 5% by mass to 400% by mass with respect to the content of the binder in the easy adhesion layer. If the content of the inorganic fine particles is 5% by mass or more, satisfactory adhesiveness may be retained when the easy adhesion layer is exposed to a hot and humid atmosphere, and if the content is 400% by mass or less, the surface state of the easy adhesion layer is retained to be good.

Among these, the content of the inorganic fine particles is preferably in the range of 50% by mass to 300% by mass.

(Crosslinking Agent)

The easy adhesion layer can contain at least one crosslinking agent.

Examples of a crosslinking agent that is suitable for the easy adhesion layer include epoxy, isocyanate, melamine, carbodiimide and oxazoline crosslinking agents. Among these, from the viewpoint of securing adhesiveness after a lapse of time under heat and moisture, an oxazoline crosslinking agent is particularly preferable.

A preferred embodiment and details of the crosslinking agent, in particular, of carbodiimide and oxazoline crosslinking agents are the same as those set forth in the polymer layer. Further, as compounds having an oxazoline group, commercially available products currently marketed, such as EPOCROS K-2010E, EPOCROS K-2020E, EPOCROS K-2030E, EPOCROS WS-500, and EPOCROS WS-700 (all trade names, manufactured by Nippon Shokubai Co., Ltd.), and the like can also be used.

The content of the crosslinking agent in the easy adhesion layer is preferably 5% by mass to 50% by mass based on the content of the binder in the easy adhesion layer, and among these, more preferably 20% by mass to 40% by mass. When the content of the crosslinking agent is 5% by mass or greater, a satisfactory crosslinking effect is obtained, and the strength or adhesiveness of the colored layer can be maintained. When the content is 50% by mass or less, a prolonged pot life of the coating liquid can be maintained.

(Additives)

The easy adhesion layer may optionally contain a known matting agent such as polystyrene, polymethyl methacrylate or silica; a known anionic or nonionic surfactant; and the like.

The formation of the easy adhesion layer may be carried out by a method of affixing a polymer sheet having easy adhesiveness to a polymer base material, or a method based on coating. Among these, the method based on coating is preferable from the viewpoint that the method is convenient, and it is possible to form a uniform thin film.

In regard to the coating method, known coating methods using, for example, a gravure coater or a bar coater can be used.

The coating solvent used in the preparation of the coating liquid may be water, or may be an organic solvent such as toluene or methyl ethyl ketone. The coating solvent may be such that one kind may be used alone, or two or more kinds may be used in a mixture.

There are no particular limitations on the thickness of the easy adhesion layer, but the thickness is usually preferably 0.05 μm to 8 μm, and more preferably in the range of 0.1 μm to 5 μm. When the thickness of the easy adhesion layer is 0.05 μm or greater, the necessary adhesiveness can be suitably obtained, and when the thickness is 8 μm or less, the surface state becomes more satisfactory.

Furthermore, the easy adhesion layer of the invention is preferable to be transparent in order not to reduce the effect of the colored layer.

—Production of Back Sheet for Solar Cell—

Regarding the back sheet for a solar cell of the present invention, the process for production thereof is not particularly limited, and can be suitably produced, for example, by the following steps. Namely, a preferable process for producing the back sheet for a solar cell of the present invention may be constituted by providing (1) a step of coating, on at least one surface of a polymer base material, a coating liquid which contains a fluorine-based polymer and/or a silicone-based polymer and an amorphous colloidal silica and, preferably, in which 60% by mass or more of the solvent is water, directly on the surface of the polymer base material or through another layer, and (2) a step of drying the coated film formed by coating on the polymer base material to obtain a polymer layer. Here, by curing the polymer layer after the formation of the polymer layer, the adhesiveness after a lapse of time under heat and moisture can be enhanced.

As described above, in a case in which the back sheet has an additional layer such as an easy adhesion layer or the like, in addition to the above steps, a step for forming the additional layer may further be provided. An example of an embodiment for formation of an additional layer is a method of coating a coating liquid containing the components that constitute the additional layer, on the polymer base material (for example, on the side of the polymer base material opposite to the side at which the polymer layer is formed), and examples thereof include the methods described above as the methods for forming an easy adhesion layer or a colored layer.

Specific examples of the back sheet for a solar cell of the present invention may include a back sheet which has a polymer layer on one surface of a polymer base material and has a reflective layer, that contains a white inorganic particle and is formed by coating, on the surface opposite to the surface at which the polymer layer is formed; a back sheet which has a polymer layer on one surface of a polymer base material and has a colored layer, that contains a color pigment and is formed by coating, on the surface opposite to the surface at which the polymer layer is formed; a back sheet which has a polymer layer on one surface of a polymer base material and has a reflective layer containing a white inorganic particle and an easy adhesion layer, in this order from the polymer base material side, on the surface opposite to the surface at which the polymer layer is formed, the reflective layer and the easy adhesion layer being formed by coating; and the like.

Further, another example of an embodiment for formation of an additional layer is a method of affixing a sheet or film, which has a layer that exhibits a function desired as the additional layer, to the surface at which the polymer layer is to be formed. In this case, the sheet or film may be a sheet or film which has one additional layer or two or more additional layers.

Specific examples of the back sheet for a solar cell of the invention include a back sheet in which a polymer layer is formed by coating on one side of a polymer base material, and a white film (or a colored film) containing a white pigment as a white inorganic particle (or a pigment having a color other than white) is affixed to the side opposite to the side at which the polymer layer is formed; a back sheet in which an aluminum thin film and a white film containing a white pigment are affixed to the side of a polymer base material opposite to the side at which a polymer layer is formed; a back sheet in which a polymer film having an inorganic barrier layer and a white film containing a white pigment are affixed to the side of a polymer base material opposite to the side at which a polymer layer is formed; and the like.

For the production of the back sheet for a solar cell of the present invention, any method may be used, so long as the method is a method capable of forming the polymer layer according to the invention by coating on a polymer base material. For example, the polymer layer according to the invention can be suitably produced by preparing a coating liquid containing at least a fluorine-based polymer and/or a silicone-based polymer as a binder and an amorphous colloidal silica, then coating the resulting coating liquid on a polymer base material, and then drying the coating liquid. After drying, the polymer layer may be cured by heating or the like. There are no particular limitations on the coating method or on the solvent of the coating liquid used.

As the method of coating, for example, a coating method utilizing a gravure coater or a bar coated can be applied.

The solvent used in the preparation of the coating liquid may be water or may be an organic solvent such as toluene or methyl ethyl ketone. One kind of a solvent may be used alone, or two or more kinds of solvents may be used in mixture. In the present invention, a method of preparing an aqueous coating liquid, in which a fluorine-based polymer and/or a silicone-based polymer used as the binder is dispersed in water, and coating this aqueous coating liquid is preferable. In this case, the proportion of water in the solvent is preferably 60% by mass or higher, and more preferably 80% by mass or higher.

Further, in a case in which the polymer support is a biaxially stretched film, a coating liquid intended for forming a polymer layer may be coated on a polymer base material that has been biaxially stretched and then the coated film may be dried. Alternatively, a method of coating the coating liquid on a polymer base material that has been uniaxially stretched, then drying the coated film, and then stretching the polymer base material in the direction different from the direction of the uniaxial stretching may be adopted. Moreover, the coating liquid may be coated on a polymer base material before stretching, and after drying the coated film, the polymer base material may be stretched in two directions.

<Solar Cell Module>

The solar cell module of the present invention is constituted by providing a transparent substrate through which sunlight enters, a solar cell element, and the above-described back sheet for a solar cell of the invention which is disposed on the side of the solar cell element opposite to the side at which the substrate is disposed. Since the solar cell module of the present invention is equipped with the above-described back sheet for a solar cell of the invention, weather resistance is excellent, and specifically, a stable power generation performance may be obtained for a long time, even in the case of being exposed to temperature and humidity variation or a high humidity and heat environment.

FIG. 1 schematically shows an example of the configuration of the solar cell module of the invention. This solar cell module 10 has a configuration in which a solar cell element 20, that converts the light energy of sunlight to electrical energy, is disposed between a transparent substrate 24, through which sunlight enters, and a back sheet (the above-described back sheet for a solar cell of the invention) 5, and the space between the substrate 24 and the back sheet 5 is sealed with an ethylene-vinyl acetate sealing material 22. The back sheet 5 according to the present exemplary embodiment is provided with two polymer layers on one side of the polymer base material 16, and is provided with a white reflective layer 18 as another layer on the other side (the side through which sunlight enters). The above two polymer layers are provided to have a laminate structure which includes, from the polymer base material side, a first polymer layer 14 and a second polymer layer 12 that is adjacent to the polymer layer 14. A fluorine-based polymer and/or a silicone-based polymer and an amorphous colloidal silica are incorporated in one or both of the first polymer layer 14 and the second polymer layer 12.

Regarding members other than the solar cell module, the solar cells, and the backsheet, they are described in detail in "Taiyoko Hatsuden System Kosei Zairyo" (under the supervision of Eiichi Sugimoto, published by Kogyo Chosakai Publishing, Inc., 2008), for example.

The transparent substrate 24 may only has a light transparency to such an extent that sunlight is allowed to pass through it, and may be selected appropriately from base materials that allow light to transmit therethrough. From the viewpoint of power generation efficiency, a transparent substrate that has a higher light transmittance is more preferable. For such a transparent substrate, a glass substrate, a transparent resin such as acrylic resin and the like may be suitably used, for example.

For the solar cell elements 20, various kinds of known solar cell elements may be used, including: solar cells based on silicon such as single crystal silicon, polycrystalline silicon, or amorphous silicon; and solar cells based on a III-V or II-VI compound semiconductor such as copper-indium-gallium-selenium, copper-indium-selenium, cadmium-tellurium, or gallium-arsenic.

EXAMPLE

The present invention will be further described in detail with reference to the following examples, but it should be construed that the present invention is in no way limited to those examples as long as not departing from the scope of the invention. Note that, if not otherwise specified particularly, "part(s)" and "%" are on the basis of mass.

Example 1

Preparation of Base Material (1) Synthesis of Polyester

Slurry that included 100 kg of high purity terephthalic acid (manufactured by MITSUI CHEMICALS, INC.) and 45 kg of ethyleneglycol (manufactured by NIPPON SHOKUBAI CO., LTD.) was fed successively over 4 hours to an esterification tank that was kept at a temperature of 250° C. and a pressure of $1.2 \times 10^5$ Pa and was preliminary loaded with 123 kg or about 123 kg of bis(hydroxyethyl)terephthalate. After feeding was completed, esterification was still continued for 1 hour. After that, 123 kg of resulting esterification product were transferred to a polycondensation reactor tank.

Subsequently, ethylene glycol was added to the polycondensation reactor tank, to which the esterification product had been transferred, in an amount of 0.3% by mass with respect to the amount of the polymer thus obtainable. After stirring for 5 minutes, ethylene glycol solutions of cobalt acetate and manganese acetate were added thereto, such that the amount that corresponds to a content of cobalt element and the amount that corresponds to a content of manganese element with respect to the polymer thus obtainable were 30 ppm and 15 ppm, respectively. After further stirring for 5 minutes, a 2% by mass ethylene glycol solution of a titanium alkoxide compound was added such that the amount that corresponds to a content of titanium element with respect to the polymer thus obtainable was 5 ppm. For the titanium alkoxide compound, the titanium alkoxide compound (Ti content=4.44% by mass) synthesized in Example 1 in paragraph [0083] of JP-A No. 2005-340616 was used. After 5 minutes, a 10% by mass ethylene glycol solution of ethyl diethylphosphonoacetate was added such that the amount was 5 ppm with respect to the polymer thus obtainable.

Thereafter, while stirring the low grade polymer at 30 rpm, the temperature of the reaction system was gradually elevated from 250° C. to 285° C., and the pressure was decreased to 40 Pa. The time taken to reach the final temperature and the final pressure was adjusted to 60 minutes. The reaction was further continued as it is for 3 hours, and then the reaction system was purged with nitrogen, and the pressure was returned to normal pressure to terminate the polycondensation reaction. Then, the polymer melt thus obtained was ejected into cold water in a strand shape, and the resultant was immediately cut, and thus pellets of the polymer (diameter: about 3 mm, length: about 7 mm) were produced.

(2) Solid Phase Polymerization

The pellets obtained as described above were maintained at a temperature of 220° C. for 30 hours in a vacuum container maintained at 40 Pa, whereby solid phase polymerization was carried out.

(3) Formation of Base

The pellets after the solid phase polymerization as described above were fused and extruded at 280° C. and were cast on a metal drum, to produce a non-stretched base having a thickness of about 2.5 mm. Subsequently, the non-stretched base was stretched in a longitudinal direction at a temperature of 90° C. in a manner that the stretch becomes 3 times, and was further stretched in a transverse direction at a temperature of 120° C. in a manner that the stretch becomes 3.3 times. Then, heat fixing was performed at 215° C. for 3 minutes, to obtain a biaxially stretched polyethylene terephthalate support (hereinafter, simply referred to as "PET support") having a thickness of 250 μm.

—Front Face Undercoat Layer—

(1) Preparation of Coating Liquid for Forming Front Face Undercoat Layer

The components in the following composition were mixed, and thus a coating liquid for forming a front face undercoat layer, the coating liquid being a coating liquid for providing an undercoat layer on the front face of the light receiving side, was prepared.

<Composition of Coating Liquid>

| | |
|---|---|
| Polyester-based binder | 48.0 parts |
| (trade name: VYLONAL DM1245 (manufactured by TOYOBO CO., LTD.; solid content: 30% by mass)) | |
| Carbodiimide compound (crosslinking agent) | 10.0 parts |
| (trade name: CARBODILITE V-02-L2, manufactured by Nisshinbo Holdings, Inc.; solid content: 10% by mass) | |
| Oxazoline compound (crosslinking agent) | 3.0 parts |
| (trade name: EPOCROS WS-700, manufactured by Nippon Shokubai Co., Ltd.; solid content: 25% by mass) | |
| Surfactant | 15.0 parts |
| (trade name: NAROACTY CL95, manufactured by Sanyo Chemical Industries, Ltd.; solid content: 1% by mass) | |
| Distilled water | 907.0 parts |

(2) Formation of Front Face Undercoat Layer

The coating liquid for forming a front face undercoat layer thus obtained was coated on one surface of the PET support such that the binder amount was 0.1 g/m² as a coating amount, and was dried at 180° C. for one minute. Thus, an undercoat layer having a dry thickness of about 0.1 μm was formed.

—Colored Layer—

(1) Preparation of Titanium Dioxide Dispersion

The components of the following composition were mixed, and the mixture was subjected to a dispersion treatment for one hour using a Dyno mill type dispersing machine. Thus, a titanium dioxide dispersion was prepared.

<Composition of Titanium Dioxide Dispersion>

| | |
|---|---|
| Titanium dioxide (volume average particle diameter = 0.42 μm) (trade name: TIPAQUE R-780-2, manufactured by Ishihara Sangyo Kaisha, Ltd.; solid content: 100% by mass) | 39.9% by mass |
| Polyvinyl alcohol (trade name: PVA-105, manufactured by Kuraray Co., Ltd.; solid content: 10% by mass) | 49.9% by mass |
| Surfactant (trade name: DEMOL EP, manufactured by Kao Corporation; solid content: 10% by mass) | 0.5% by mass |
| Distilled water | 9.7% by mass |

(2) Preparation of Coating Liquid for Forming Colored Layer

The components of the following composition were mixed, and thus a coating liquid for forming a colored layer was prepared.

<Composition of Coating Liquid>

| | |
|---|---|
| Titanium dioxide dispersion described above | 80.0% by mass |
| Silanol-modified polyvinyl alcohol binder (trade name: R1130, manufactured by Kuraray Co., Ltd.; solid content: 7% by mass) | 11.4% by mass |
| Polyoxyalkylene alkyl ether (trade name: NAROACTY CL95, manufactured by Sanyo Chemical Industries, Ltd.; solid content: 1% by mass) | 3.0% by mass |
| Oxazoline compound (trade name: EPOCROS WS-700, manufactured by Nippon Shokubai Co., Ltd.; solid content: 25% by mass; crosslinking agent) | 2.0% by mass |
| Distilled water | 5.6% by mass |

(3) Formation of Colored Layer

The coating liquid thus obtained was coated on the front face undercoat layer which had been formed on the PET support, and was dried at 180° C. for one minute. Thus, a colored layer having a titanium dioxide amount of 7.0 g/m$^2$ and a binder amount of 1.2 g/m$^2$ was formed.

—Rear Face Polymer Layer 1—

(1) Preparation of Coating Liquid for Forming Rear Face Polymer Layer 1

The components of the following composition were mixed, and thus a coating liquid for forming rear face polymer layer 1 was prepared. Note that, the volume average particle diameter of the colloidal silica was about 60 nm (which was measured in accordance with a light scattering method using a laser diffraction/scattering type particle diameter distribution measuring apparatus LA950 (trade name, manufactured by Horiba Ltd.)).

<Composition of Coating Liquid>

| | |
|---|---|
| Silicone/acryl-based binder (binder P-1) (trade name: CERANATE WSA-1070, manufactured by DIC Corporation; solid content: 40% by mass) | 310 parts |
| Colloidal silica (CS-1) (trade name: SNOWTEX UP, manufactured by Nissan Chemical Industries, Ltd.; solid content 20% by mass; volume average particle diameter: about 60 nm) | 12.4 parts |
| Carbodiimide compound (crosslinking agent) (trade name: CARBODILITE V-02-L2, manufactured by Nisshinbo Holdings, Inc.; solid content: 25% by mass) | 24 parts |
| Oxazoline compound (crosslinking agent) (trade name: EPOCROS WS-700, manufactured by Nippon Shokubai Co., Ltd.; solid content: 25% by mass) | 24 parts |
| Surfactant (trade name: NAROACTY CL95, manufactured by Sanyo Chemical Industries, Ltd.; solid content: 1% by mass) | 1.0 parts |
| Titanium dioxide dispersion | 206 parts |
| Distilled water | 435 parts |

(2) Formation of Rear Face Polymer Layer 1

The coating liquid for forming rear face polymer layer 1 thus obtained was coated on a surface of the side of the PET support opposite to the side at which the colored layer had been formed, using a Mayor bar #12, and was dried at 175° C. for 3 minutes. Thus, rear face polymer layer 1 was formed.

In this way, a back sheet sample, in which the layers on the two sides of the PET support were each provided as coated layers by means of coating, was produced.

—Production of Solar Cell Module—

A reinforced glass having a thickness of 3 mm, an EVA sheet (trade name: SC50B, manufactured by Mitsui Chemical Fabro, Inc.), a crystalline silicon solar cell, an EVA sheet (trade name: SC50B, manufactured by Mitsui Chemical Fabro, Inc.), and a back sheet sample, which had been produced as described above and had been subjected to the same treatment as that described in the following evaluation of "(2) Adhesiveness after lapse of time under moisture and heat" in "3. Adhesiveness", were stacked in this order, and then the assembly was hot pressed using a vacuum laminator (manufactured by Nisshinbo Holdings, Inc.; a vacuum laminating machine) to cause the layers to adhere to each other. In this process, the back sheet sample was arranged such that the surface of the colored layer thereof was in contact with the EVA sheet. The adhesion conditions were as follows. Namely, a vacuum was drawn at 128° C. for 3 minutes using a vacuum laminator, and then provisional adhesion was conducted by applying pressure to the assembly for 2 minutes. Thereafter, the assembly was subjected to a main adhesion treatment in a dry oven at 150° C. for 30 minutes. In this way, a crystalline silicon solar cell module was produced.

The solar cell module thus produced was used to perform power generation operation, and the solar cell module exhibited satisfactory power generation performance as a solar cell.

Examples 2 to 6

Back sheet samples were produced in a manner substantially similar to that in Example 1, except that the content of colloidal silica in the composition of the coating liquid for forming rear face polymer layer 1 in Example 1 was changed as shown in Table 1 below.

Comparative Example 1

A back sheet sample was produced in a manner substantially similar to that in Example 1, except that the colloidal silica used in the preparation of the coating liquid for forming rear face polymer layer 1 in Example 1 was not added.

Example 7, and Comparative Examples 2 and 3

Back sheet samples were produced in a manner substantially similar to that in Example 4, except that the binder in the composition of the coating liquid for forming rear face polymer layer 1 in Example 4 was changed as shown in Table 1 below.

Examples 8 to 12

Back sheet samples were produced in a manner substantially similar to that in Example 4, except that the content of binder in the composition of the coating liquid for forming rear face polymer layer 1 in Example 4 was changed as shown in Table 1 below.

Examples 13 and 14, and Comparative Examples 4 and 5

Back sheet samples were produced in a manner substantially similar to that in Example 4, except that the colloidal silica in the composition of the coating liquid for forming rear face polymer layer 1 in Example 4 was changed as shown in Table 1 below.

Example 15

A back sheet sample was produced in a manner substantially similar to that in Example 4, except that a coating liquid for forming rear face polymer layer 2 was coated, according to the procedure shown below, on the surface of the polymer layer 1, which had been formed on the surface of the side of the PET support opposite to the side at which the colored layer had been disposed, to further form rear face polymer layer 2, in Example 4.

—Formation of Rear Face Polymer Layer 2—
(1) Preparation of Coating Liquid for Forming Rear Face Polymer Layer 2

The components of the following composition were mixed, and thus a coating liquid for forming rear face polymer layer 2 was prepared. Note that, the volume average particle diameter of the colloidal silica was measured in a manner as described above, in accordance with a light scattering method.

<Composition of Coating Liquid>

| | |
|---|---|
| Silicone/acryl-based binder (binder P-1) (trade name: CERANATE WSA-1070, manufactured by DIC Corporation; solid content: 40% by mass) | 311 parts |
| Carbodiimide compound (crosslinking agent) (trade name: CARBODILITE V-02-L2, manufactured by Nisshinbo Holdings, Inc.; solid content: 25% by mass) | 50 parts |
| Surfactant (trade name: NAROACTY CL95, manufactured by Sanyo Chemical Industries, Ltd.; solid content: 1% by mass) | 2 parts |
| Colloidal silica (CS-1) (trade name: SNOWTEX UP, manufactured by Nissan Chemical Industries, Ltd.; solid content 20% by mass; volume average particle diameter: about 60 nm) | 187 parts |
| Distilled water | 450 parts |

(2) Formation of Rear Face Polymer Layer 2

The coating liquid for forming rear face polymer layer 2 thus obtained was coated on the rear face polymer layer 1 using a Mayor bar #8, and was dried at 175° C. for 3 minutes. Thus, rear face polymer layer 2 was formed.

In this way, a back sheet sample, in which the layers on the two sides of the PET support were each provided as coated layers by means of coating, was produced.

Examples 16 and 17

Back sheet samples were produced in a manner substantially similar to that in Example 15, except that the binder in the composition of the coating liquid for forming rear face polymer layer 2 in Example 15 was changed as shown in Table 1 below.

Examples 18 and 19, and Comparative Examples 6 and 7

Back sheet samples were produced in a manner substantially similar to that in Example 15, except that the colloidal silica in the composition of the coating liquid for forming rear face polymer layer 2 in Example 15 was changed as shown in Table 1 below.

(Evaluation)

With regard to the back sheet samples produced in the above Examples and Comparative Examples, the following evaluations were carried out. The evaluation results are shown in Table 1 below.

—1. Cissing—

The back sheet sample thus produced was cut into a sample piece having a size of 30 cm×40 cm. Three sheets of this sample piece were prepared, and the surface of the rear face polymer layer 1 was visually observed and the number of the sites where cissing of the coating liquid was recognized was counted. Note that, with regard to Examples 15 to 19 and Comparative Examples 6 and 7, evaluation was performed on each of the rear face polymer layer 1 and the rear face polymer layer 2.

—2. Surface State—

The back sheet sample thus produced was cut into a sample piece having a size of 30 cm×40 cm. One sheet of the sample piece was visually observed, and the appearance of unevenness was evaluated according to the following evaluation criteria.

<Evaluation Criteria>

5: compared with Comparative Example 1, the frequency of occurrence of unevenness is lower, and the unevenness that has occurred is not noticeable.

4: compared with Comparative Example 1, the number of sites where unevenness is recognized is smaller.

3: the degree of occurrence of unevenness is about the same as that in Comparative Example 1.

2: compared with Comparative Example 1, the frequency of occurrence of unevenness is higher.

1: compared with Comparative Example 1, the number of sites where unevenness is recognized is greater.

Among the above criteria, the grades 3, 4, and 5 are deemed as practically acceptable.

—3. Adhesiveness—

(1) Adhesiveness Before Lapse of Time Under Moisture and Heat

Six cuts were inserted on the surface of the rear face polymer layer 1 (however, with regard to Examples 15 to 19 and Comparative Examples 6 and 7, the rear face polymer layer 2) of the back sheet produced as described above in the longitudinal direction and the transverse direction, respectively, using a single-bladed razor, to form 25 squares. Mylar tape (polyester tape) was adhered thereon, and then the tape was peeled by manually pulling the tape along the sample surface in the 180° direction. In this process, based on the number of peeled squares, evaluation of the adhesion power of the rear face polymer layer was performed according to the following evaluation criteria. Evaluation grades 4 and 5 fall in the practically acceptable range.

<Evaluation Criteria>

5: there are no peeled squares (0 squares).

4: the number of peeled squares is more than 0 squares but less than 0.5 squares.

3: the number of peeled squares is 0.5 squares or more but less than 2 squares.

2: the number of peeled squares is 2 squares or more but less than 10 squares.

1: the number of peeled squares is 10 squares or more.

(2) Adhesiveness after Lapse of Time Under Moisture and Heat

The back sheet produced as described above was maintained for 48 hours under the environmental conditions of 120° C. and 100% relative humidity, and then was subjected to humidity adjustment for one hour under an environment of 25° C. and 60% relative humidity. Thereafter, evaluation of the adhesion power of the rear face polymer layer was performed by the same method as that used in the evaluation of the above "(1) Adhesiveness before lapse of time under moisture and heat".

the coating liquid, when the polymer layer was formed by coating, could not be settled and, as a result, the film state of the polymer layer formed was bad, and the weather resistance could not be maintained satisfactory.

The foregoing description of the exemplary embodiments of the present invention has been provided for the purposes of illustration and description. It is not intended to be exhaustive or to limit the invention to the precise forms disclosed. The embodiments were chosen and described in order to best explain the principles of the invention and its practical applications, thereby enabling others skilled in the art to understand the invention for various embodiments and with the various modifications as are suited to the particular use contemplated.

This application claims priority from Japanese Patent Application No. 2010-254210 filed on Nov. 12, 2010, the

TABLE 1

| | | Polymer Layer 1 | | | Polymer Layer 2 | | | Evaluation | | | | |
|---|---|---|---|---|---|---|---|---|---|---|---|---|
| | Kind of binder | Amount of Binder [g/m²] | Kind of Colloidal silica | Amount of Colloidal silica [%] (*1) | Kind of binder | Amount of Binder [g/m²] | Kind of Colloidal silica | Amount of Colloidal silica [%] (*1) | Adhesiveness (BLTMH) | Adhesiveness (ALTMH) | Surface State | Cissing RFPL1 | Cissing RFPL2 |
| CEx1 | P-1 | 3 | none | 0 | none | none | none | none | 4 | 3 | 5 | 26 | — |
| Ex1 | P-1 | 3 | CS-1 | 2 | none | none | none | none | 5 | 5 | 5 | 6 | — |
| Ex2 | P-1 | 3 | CS-1 | 5 | none | none | none | none | 5 | 5 | 5 | 3 | — |
| Ex3 | P-1 | 3 | CS-1 | 10 | none | none | none | none | 5 | 5 | 5 | 1 | — |
| Ex4 | P-1 | 3 | CS-1 | 30 | none | none | none | none | 5 | 5 | 5 | 1 | — |
| Ex5 | P-1 | 3 | CS-1 | 50 | none | none | none | none | 5 | 5 | 5 | 1 | — |
| Ex6 | P-1 | 3 | CS-1 | 70 | none | none | none | none | 5 | 5 | 3 | 1 | — |
| Ex7 | P-1 | 3 | CS-1 | 30 | none | none | none | none | 5 | 5 | 5 | 3 | — |
| CEx2 | P-101 | 3 | CS-1 | 30 | none | none | none | none | 5 | 1 | 5 | 1 | — |
| CEx3 | P-102 | 3 | CS-1 | 30 | none | none | none | none | 5 | 1 | 5 | 2 | — |
| Ex8 | P-1 | 0.2 | CS-1 | 30 | none | none | none | none | 5 | 5 | 5 | 4 | — |
| Ex9 | P-1 | 1 | CS-1 | 30 | none | none | none | none | 5 | 5 | 5 | 2 | — |
| Ex10 | P-1 | 5 | CS-1 | 30 | none | none | none | none | 5 | 5 | 5 | 1 | — |
| Ex11 | P-1 | 10 | CS-1 | 30 | none | none | none | none | 5 | 5 | 5 | 1 | — |
| Ex12 | P-1 | 15 | CS-1 | 30 | none | none | none | none | 5 | 5 | 3 | 0 | — |
| Ex13 | P-1 | 3 | CS-1 | 30 | none | none | none | none | 5 | 5 | 5 | 2 | — |
| Ex14 | P-1 | 3 | CS-1 | 30 | none | none | none | none | 5 | 5 | 5 | 1 | — |
| CEx4 | P-1 | 3 | CS-101 | 30 | none | none | none | none | 5 | 5 | 5 | 13 | — |
| CEx5 | P-1 | 3 | CS-102 | 30 | none | none | none | none | 5 | 4 | 5 | 16 | — |
| Ex15 | P-1 | 3 | CS-1 | 30 | P-1 | 2 | CS-1 | 30 | 5 | 5 | 5 | 1 | 1 |
| Ex16 | P-1 | 3 | CS-1 | 30 | P-2 | 2 | CS-1 | 30 | 5 | 5 | 5 | 2 | 4 |
| Ex17 | P-1 | 3 | CS-1 | 30 | P-3 | 2 | CS-1 | 30 | 5 | 5 | 5 | 1 | 2 |
| Ex18 | P-1 | 3 | CS-1 | 30 | P-1 | 2 | CS-2 | 30 | 5 | 5 | 5 | 2 | 2 |
| Ex19 | P-1 | 3 | CS-1 | 30 | P-1 | 2 | CS-3 | 30 | 5 | 5 | 5 | 1 | 3 |
| CEx6 | P-1 | 3 | CS-1 | 30 | P-1 | 2 | CS-101 | 30 | 4 | 4 | 5 | 1 | 16 |
| CEx7 | P-1 | 3 | CS-1 | 30 | P-1 | 2 | CS-102 | 30 | 5 | 4 | 5 | 1 | 22 |

In Table 1, the abbreviation "Ex" denotes "Example", the abbreviation "CEx" denotes "Comparative Example", the abbreviation "BLTMH" denotes "Before Lapse of Time Under Moisture and Heat", the abbreviation "ALTMH" denotes "After Lapse of Time Under Moisture and Heat", the abbreviation "RFPL1" denotes "Rear Face Polymer Layer 1", and the abbreviation "RFPL2" denotes "Rear Face Polymer Layer 2".

Further, [%] (*1) in Table 1 denotes a proportion of the colloidal silica relative to the total amount of the fluorine-based polymer and the silicone-based polymer.

Details of the components in Table 1 above are described below.

<Binder>

P-1: CERANATE WSA-1070 (trade name, manufactured by DIC Corporation; silicone/acryl-based binder)
P-2: CERANATE WSA-1060 (trade name, manufactured by DIC Corporation; silicone/acryl-based binder)
P-3: OBBLIGATO SW0011F (trade name, manufactured by AGC COAT-TECH CO., LTD.; fluorine-based binder)
P-101: FINETEX ES650 (trade name, manufactured by DIC Corporation; polyester-based binder)
P-102: OLESTAR UD350 (trade name, manufactured by Mitsui Chemicals, Inc.: polyurethane binder)

<Colloidal Silica>

CS-1: SNOWTEX UP (trade name, manufactured by Nissan Chemical Industries, Ltd.; amorphous colloidal silica; volume average particle diameter: about 60 nm)
CS-2: SNOWTEX PS-S (trade name, manufactured by Nissan Chemical Industries, Ltd.; amorphous colloidal silica; volume average particle diameter: about 100 nm)
CS-3: SNOWTEX PS-M (trade name, manufactured by Nissan Chemical Industries, Ltd.; amorphous colloidal silica; volume average particle diameter: about 110 nm)
CS-101: SNOWTEX C (trade name, manufactured by Nissan Chemical Industries, Ltd.; spherical colloidal silica particles; volume average particle diameter: 15 nm)
CS-102: SNOWTEX ZL (trade name, manufactured by Nissan Chemical Industries, Ltd.; spherical colloidal silica particles; volume average particle diameter: 80 nm)

As shown in Table 1 above, in the Examples, a polymer layer having high uniformity was formed, and specifically, a decrease in adhesiveness was suppressed even in the case of being exposed to a hot and humid environment, and thus satisfactory weather resistance was exhibited. On the contrary, in the Comparative Examples, the problem of cissing of disclosure of which is incorporated by reference herein. All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

What is claimed is:

1. A back sheet for a solar cell, the back sheet comprising:
   a polymer base; and
   a polymer layer that is provided on at least one surface of the polymer base, that includes, as a binder, a polymer selected from a fluorine-based polymer or a silicone-based polymer, and that includes a colloidal silica in which plural spherical particles are linked together to form a chain-like shape,
   wherein a total amount of the fluorine-based polymer and the silicone-based polymer in the polymer layer is in a range of from 0.5 $g/m^2$ to 9.0 $g/m^2$.

2. The back sheet for a solar cell according to claim 1, wherein a content of the colloidal silica in the polymer layer is in a range of from 3.0% by mass to 60.0% by mass with respect to a total content of the fluorine-based polymer and the silicone-based polymer.

3. The back sheet for a solar cell according to claim 1, wherein the polymer layer is disposed on a side of the polymer base opposite to a side at which a solar cell element is to be disposed.

4. A method of producing a back sheet for a solar cell, the method comprising forming a polymer layer by:
   applying, onto at least one surface of a polymer base, a coating liquid that includes, as a binder, a polymer selected from a fluorine-based polymer or a silicone-based polymer, and that includes a colloidal silica in which plural spherical particles are linked together to form a chain-like shape,
   wherein a total amount of the fluorine-based polymer and the silicone-based polymer in the polymer layer is in a range of from 0.5 $g/m^2$ to 9.0 $g/m^2$; and
   drying the applied coating liquid to obtain a polymer layer.

5. A solar cell module comprising a transparent substrate through which sunlight enters, a solar cell element, and the back sheet for a solar cell according to claim 1, the back sheet for a solar cell being disposed on a side of the solar cell element opposite to a side at which a substrate is disposed.

6. The back sheet for a solar cell according to claim 1, wherein a content of the colloidal silica with respect to a total content of the fluorine-based polymer and the silicone-based polymer is in a range of from 30% by mass to 70.0% by mass.

* * * * *